United States Patent [19]

Hopson, Jr.

[11] Patent Number: 5,484,517
[45] Date of Patent: Jan. 16, 1996

[54] METHOD OF FORMING MULTI-ELEMENT THIN HOT FILM SENSORS ON POLYIMIDE FILM

[75] Inventor: Purnell Hopson, Jr., Seaford, Va.

[73] Assignee: Administrator, National Aeronautics and Space Administration, Washington, D.C.

[21] Appl. No.: 209,509

[22] Filed: Mar. 8, 1994

[51] Int. Cl.⁶ ...................................................... C25D 5/00
[52] U.S. Cl. ........................ 205/88; 205/165; 205/181; 205/205; 205/926; 427/585; 427/600
[58] Field of Search ........................... 205/88, 181, 165, 205/926, 205; 427/585, 600

[56] References Cited

U.S. PATENT DOCUMENTS

| | | | |
|---|---|---|---|
| 4,433,576 | 2/1984 | Shih et al. | 73/204 |
| 4,635,475 | 1/1987 | Jones et al. | 73/204 |
| 4,848,153 | 7/1989 | Stack et al. | 73/432.1 |
| 4,917,940 | 4/1990 | Hopson, Jr. | 428/216 |
| 4,936,146 | 6/1990 | Stack et al. | 73/432.1 |
| 5,158,801 | 10/1992 | Hopson, Jr. et al. | 427/58 |

FOREIGN PATENT DOCUMENTS

| | | |
|---|---|---|
| 172563 | 7/1989 | Japan . |
| 274261 | 12/1991 | Japan . |

OTHER PUBLICATIONS

P. Hopson, Jr. "Thin Hot–Film Smsors on Polyimide Film", *NASA Tech Brief*, pub. date Mar. 8, 1993, pp. 102–103.

Primary Examiner—John Niebling
Assistant Examiner—Edna Wong
Attorney, Agent, or Firm—George F. Helfrich

[57] ABSTRACT

The invention comprises a method of forming a multi-element, thin hot film sensor on a polyimide film. The sensor is formed by first cleaning one surface of the polyimide. Then, under a continuous vacuum, the surface is simultaneously cleaned by ion bombardment while nickel is deposited by evaporation. The ion beam cleaning is discontinued and copper is then deposited to an initial thickness by evaporation without a break in the vacuum. The vacuum is then removed and a final thickness of copper is deposited by plating. Sensor patterns are then defined in the nickel and copper layers using conventional photolithography and etching techniques.

7 Claims, 2 Drawing Sheets

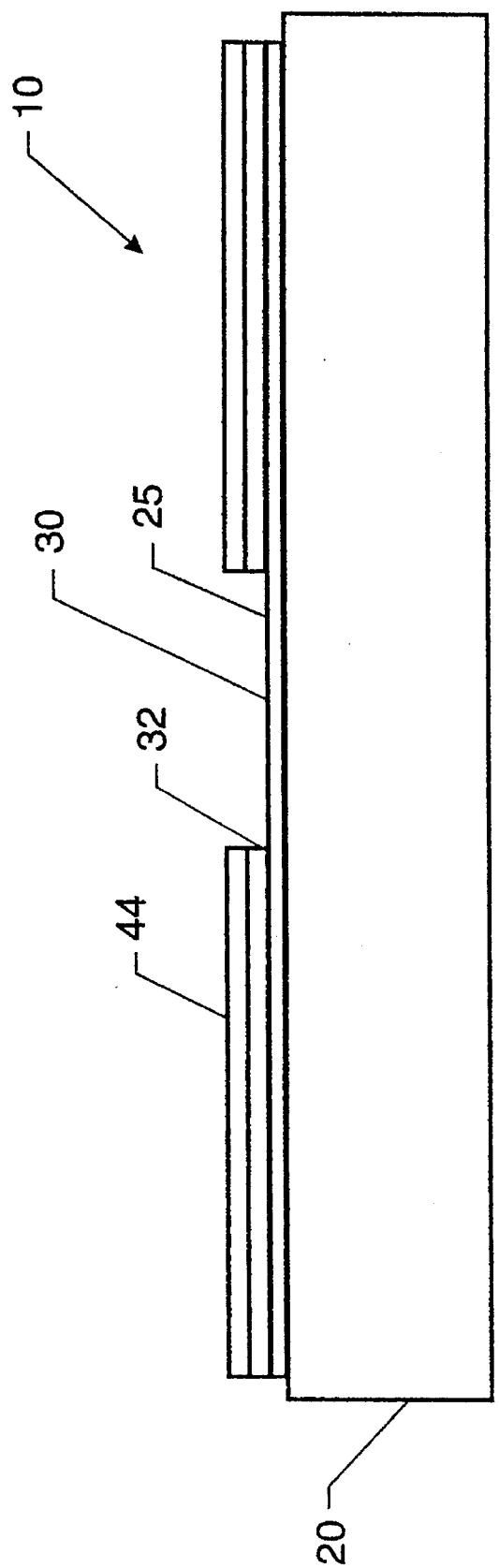

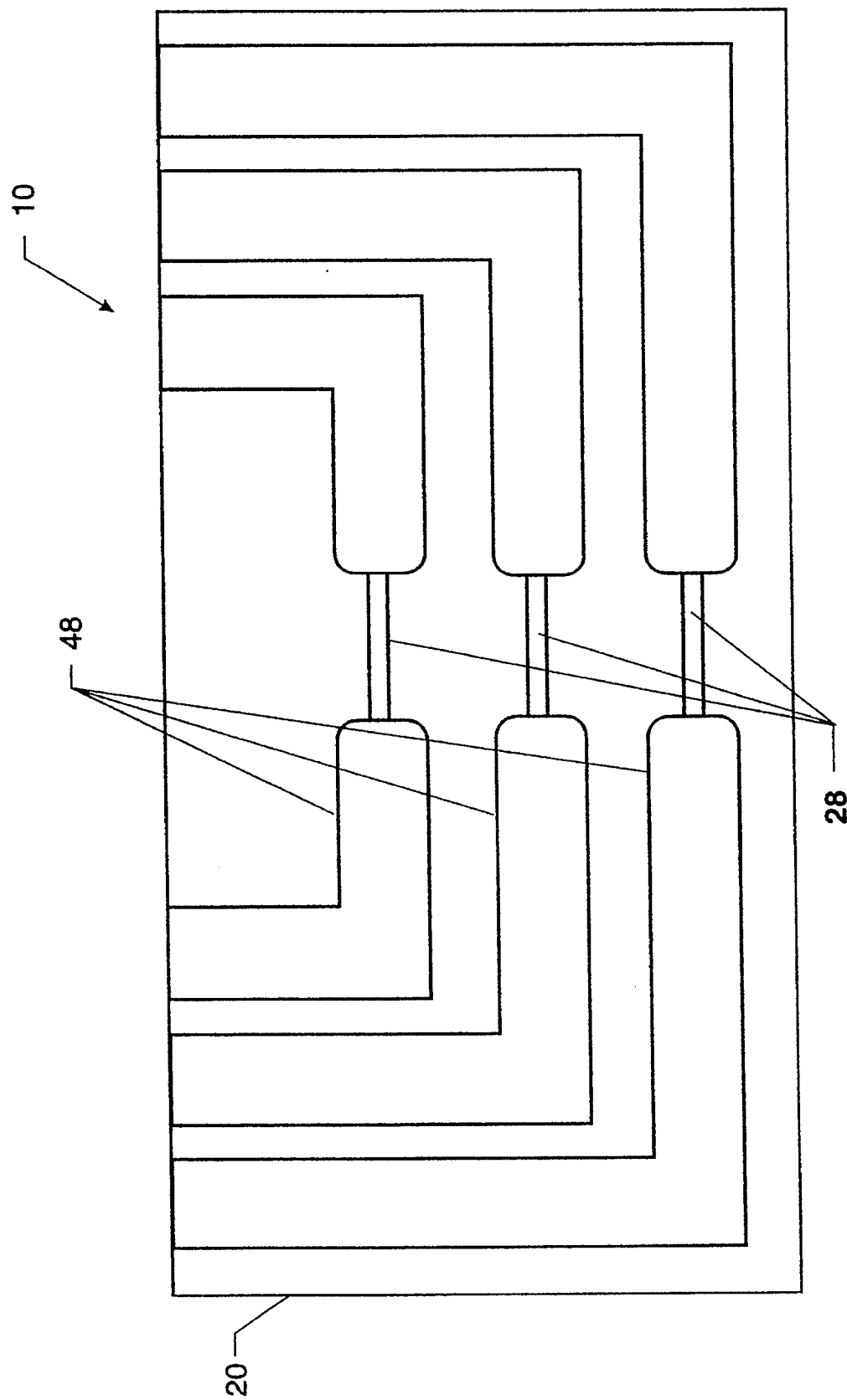

METHOD OF FORMING MULTI-ELEMENT THIN HOT FILM SENSORS ON POLYIMIDE FILM

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

1. Field of the Invention

The present invention relates generally to the formation of a metal onto a polyimide film and more particularly to the formation of multi-element, thin, hot film sensors on a polyimide film.

2. Description of the Related Art

The formation of a metal onto a polyimide film has important applications in the formation of multi-element, thin, hot film sensors. Sensors of this type are used to investigate boundary layer behavior on an airfoil surface, in order to design airfoils having higher lift and lower drag. For example, U.S. Pat. No. 4,848,153 to Stack et al., discloses the use of a multi-element sensor located on an airfoil to simultaneously detect laminar flow separation and reattachment by sensing the phase reversal in specific regions. Measurements of boundary layers typically have been made using pressure tube and hot-wire probes, both of which intrude into the boundary-layer flow and exhibit relatively poor resolution.

Existing methods of thin-film metallization of polyimides or other polymer films include: vapor deposition, sputter deposition and adhesive bonding sheets of metal foil. However, current practice using these techniques generally results in poor adhesion between subsequently applied metal layers. In contrast, the present invention results in thin sensors with excellent adhesion between metal layers.

In the present invention, each sensor element is formed by simultaneously bombarding a non-conductive polyimide layer with an ion beam while electron beam evaporating a layer of nickel onto the polyimide surface. Copper-coated nickel film electrical leads are then connected to each sensor element.

SUMMARY OF THE INVENTION

It is accordingly an object of the present invention to form metal elements on a polyimide film.

It is another object of the present invention to form hot film sensors on a polyimide film.

It is a further object of the present invention to fabricate a multi-element, thin, hot film sensor on a polyimide film with sufficient density to improve resolution.

The above and numerous other objects are achieved by a method of the invention which generally includes the steps of: cleaning the polyimide film surface, drying the film, ion beam cleaning the polyimide film in a vacuum while simultaneously evaporating nickel onto the polyimide, maintaining the vacuum while evaporating a thickness of copper over the nickel deposit, plating an additional thickness of copper on the previously evaporated thickness of copper, and defining a sensor pattern in the copper and nickel layers using standard photolithography and wet chemical etching.

BRIEF DESCRIPTION OF THE DRAWINGS

FIG. 1 is a an exploded, cross-sectional view of a preferred thin hot film sensor on polyimide film in accordance with this invention.

FIG. 2 is a top view of a preferred thin hot film sensor illustrating a sensor pattern on polyimide film.

DESCRIPTION OF THE PREFERRED EMBODIMENTS

FIG. 1 illustrates a typical multi-element thin hot film sensor 10 according to the present invention comprising a polyimide film substrate 20, a layer of nickel 30 and a layer of copper comprising an initial thickness of copper 42 deposited by evaporation and an additional thickness of copper 44 deposited by electroplating. The size of the polyimide film 20 may vary, but for a typical sixty-element array, the film may be approximately twelve inches wide, fifteen inches long and 0.002 in. thick. To prepare a sensor, one surface of the polyimide film 25 was cleaned ultrasonically for five minutes in a hot solution (i.e., at least 180° F.) of deionized water and biodegradable detergent, followed by a rinse in running room temperature deionized water. The film 20 was again ultrasonically cleaned in hot (i.e., at least 180° F.) deionized water for three to five minutes, once again rinsed in room temperature deionized water, and blown dry with dry nitrogen. The film 20 was then placed in an oven at approximately 350° F. for 30 minutes to drive out absorbed water.

The film 20 was placed in a vacuum chamber equipped with a multi-crucible electron source, and an ion beam gun for ion beam cleaning. The chamber was evacuated to a pressure of approximately 2 to $3 \times 10^{-6}$ Torr. Argon ion cleaning of the polyimide film surface 25 was initiated with a beam energy of 300 to 500 electron volts and a beam current of 5 to 20 milliamperes per square centimeter. This atomic cleaning of the film surface 25 permits improved adhesion of the subsequently deposited nickel layer 30. While ion beam cleaning continued, high purity nickel (i.e., at least 99.5%) was evaporated onto the film substrate 25 by electron beam bombardment at a rate of approximately 2 to 3 angstroms per second until a nickel coating thickness 30 of approximately 200 angstroms was obtained. At this point ion bombardment was discontinued and argon gas flow to the ion gun was stopped; but the nickel evaporation was continued until the nickel layer 30 was the desired thickness, in this case 2500 angstroms. Ion bombardment of the nickel layer 30 as it was deposited had the benefit of reducing stress and resistance in the deposited layer. In a variation on this step in the procedure, the ion bombardment may continue throughout deposition of the entire thickness of the nickel layer 30. Thickness of the nickel layer 30 may be varied and depends on the desired electrical resistance and geometry of the sensor 10. Although electron beam evaporation is disclosed in this example, any vapor deposition or sputtering technique may be used that will enable deposition of very thin metal layers.

After the nickel deposition, and without breaking vacuum, a copper layer was formed on the nickel layer 30 wherein an initial thickness of high purity copper 42 (i.e., at least 99.5%), was deposited by evaporation to a thickness of approximately 1000 angstroms over the nickel deposit 30. This initial thickness of copper 42 was a seed layer for further copper electroplating. It was necessary to deposit the copper over the nickel without breaking vacuum, otherwise a thin layer of nickel oxide would grow over the very high purity nickel preventing other materials from adhering properly to the nickel surface.

An additional thickness of copper 44 was plated on the copper thickness 42 that was previously deposited by electron beam evaporation. This additional copper thickness is necessary to reduce the electrical resistance of the electrical leads 48, as illustrated in FIG. 2. Conventional copper-sulfate copper plating processes, such as that used for printed circuit board manufacturing, were used to plate additional copper 44 onto the initial thickness of copper 42 previously deposited by evaporation. A slight process modification was necessary to get successful bright copper on the polyimide substrate 20. The initial plating current density was kept very low (e.g., 5 amperes per square foot) until the sheet resistance was reduced sufficiently to prevent cold plating or nickel peeling; the remaining plating was done at approximately 10 amperes per square foot. Although the copper thickness 44 fabricated in this example had thicknesses of approximately 2 to 5 micrometers, the thickness may vary and is dependant upon the application for which the sensor is used.

Conventional photolithography and wet chemical etching was utilized to define a sensor pattern comprising sensor elements 28 and electrical leads 48, as illustrated in FIG. 2. Photoresist was applied to the metallized film by either dipping or spinning and then prebaked at 90° C. for 30 minutes in an air circulating or convection oven. A contact exposure was made in the photoresist using an ultraviolet source, and the resist was developed.

Metal etching was performed by using an etchant containing 60% deionized water, 30% concentrated sulfuric acid and 10% hydrogen peroxide (30 to 38% concentration) to define the nickel sensor 28 and nickel/copper lead pattern 48. Etchant temperature was between 120° and 150° F. A final etch using 5 grams of ammonium persulfate to 100 cc. of deionized water and 5% by volume hydrogen peroxide (30% concentration), was used to remove the copper from the nickel sensing element 28. Other etchants may be used for etching, but these etchants are inexpensive to prepare and yield good line definition.

Many modifications, improvements and substitutions will be apparent to those skilled in the art without departing from the spirit and scope of the present invention as described in the specification and defined in the following claims.

What is claimed is:

1. A method of forming a multi-element thin hot film sensor on a polyimide film substrate comprising the steps of:

cleaning a surface of the polyimide substrate;

forming a first layer of nickel by evaporation on the cleaned polyimide surface and simultaneously bombarding the surface with an ion beam, wherein the simultaneous ion beam bombardment and nickel deposition are performed under a vacuum;

forming a second layer, wherein the second layer is further comprised of an initial layer of copper deposited by evaporation in a vacuum on the first layer of nickel, and a remaining thickness of copper formed by electroplating, wherein the vacuum is continuous throughout deposition of both the nickel layer and the initial copper layer;

defining a sensor pattern in the copper and nickel layers.

2. The method of claim 1 wherein the cleaning of the polyimide substrate is done ultrasonically.

3. The method of claim 2 wherein the cleaned polyimide substrate is dried in an oven to remove absorbed water prior to deposition of the nickel layer.

4. The method of claim 1 wherein the ion bombardment is carried out in argon gas.

5. The method of claim 1 wherein the electroplating is performed at an initial current density of up to 5 amperes per square foot until the resistance of the copper layer is reduced sufficiently to prevent cold plating and nickel peeling; and the current density for the remainder of the electroplating is approximately 10 amperes per square foot.

6. The method of claim 1 wherein the first layer of nickel is at least 99.5% pure nickel and the second layer of copper is at least 99.5% pure copper.

7. The method of claim 6 wherein the first layer of nickel is up to 2500 angstroms thick;

the initial thickness of the second layer of copper is up to 1000 angstroms thick; and the remaining thickness of the second layer of copper is up to 5 micrometers thick.

* * * * *